(12) United States Patent
Yanagishima et al.

(10) Patent No.: US 8,823,438 B2
(45) Date of Patent: Sep. 2, 2014

(54) SIGNAL TRANSMISSION CIRCUIT, INTEGRATED CIRCUIT AND ELECTRIC DEVICE INCLUDING THEREOF FOR TRANSMITTING A PLURALITY OF SIGNALS EACH HAVING DIFFERENT TRANSMISSION SPEED

(71) Applicant: Rohm Co., Ltd., Kyoto (JP)

(72) Inventors: Daiki Yanagishima, Kyoto (JP);
Toshiyuki Ishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/923,555

(22) Filed: Jun. 21, 2013

(65) Prior Publication Data

US 2014/0002168 A1 Jan. 2, 2014

(30) Foreign Application Priority Data

Jun. 22, 2012 (JP) .................. 2012-140966

(51) Int. Cl.
*H03K 3/00* (2006.01)
*G06F 1/04* (2006.01)

(52) U.S. Cl.
USPC ............ 327/296; 327/291; 327/295; 327/171

(58) Field of Classification Search
CPC .......... H03K 3/01; H03K 3/313; H03K 3/64; H03K 3/72; H03K 5/15; H03K 5/15013; H03K 5/1506; G06F 1/04; G06F 1/06

USPC .................. 327/291, 295–296, 298, 171–174
See application file for complete search history.

(56) References Cited

U.S. PATENT DOCUMENTS

| | | | |
|---|---|---|---|
| 7,426,239 B2 * | 9/2008 | Taghizadeh-Kaschani | .. 375/259 |
| 2009/0322380 A1 | 12/2009 | Yanagishima et al. | |
| 2012/0212251 A1 * | 8/2012 | Yanagishima et al. | ... 324/762.01 |

FOREIGN PATENT DOCUMENTS

JP 2010-010762 1/2010

* cited by examiner

*Primary Examiner* — An Luu
(74) *Attorney, Agent, or Firm* — Fish & Richardson P.C.

(57) ABSTRACT

A signal transmission circuit 200 transmits input signals IN1 and IN2 each having a different transmission speed in a mutually electrically insulated manner. Signal transmission circuit 200 includes a pulse generation unit 210, transmission units 230 and 235, a latch circuit 250, and an oscillation determination circuit 270.
Transmission units 230 and 235 transmit pulse signals PLS_A and PLS_B generated by pulse generation unit 210 in accordance with logical states of input signals IN1 and IN2 to latch circuit 250 and oscillation determination circuit 270 in a mutually electrically insulated manner. Latch circuit 250 restores input signal IN1 in accordance with rising edges of pulse signals PLS_A and PLS_B. Oscillation determination circuit 270 restores input signal IN2 based on oscillation states of pulse signals PLS_A and PLS_B. With such a configuration, a plurality of signals each having a different transmission speed can be transmitted in a mutually electrically insulated manner.

10 Claims, 5 Drawing Sheets

SIGNAL TRANSMISSION CIRCUIT, INTEGRATED CIRCUIT AND ELECTRIC DEVICE INCLUDING THEREOF FOR TRANSMITTING A PLURALITY OF SIGNALS EACH HAVING DIFFERENT TRANSMISSION SPEED

This nonprovisional application is based on Japanese Patent Application No. 2012-140966 filed on Jun. 22, 2012 with the Japan Patent Office, the entire contents of which are hereby incorporated by reference.

BACKGROUND OF THE INVENTION

1. Field of the Invention

The present invention relates to a signal transmission circuit, an integrated circuit and an electric device including thereof, and more particularly to a signal transmission technique for a plurality of signals each having a different transmission speed.

2. Description of the Background Art

There has been known a method for transmitting a pulse signal generated based on a signal to be transmitted, by using a pulse transformer, a photocoupler or the like, when transmitting an electrical signal in a mutually electrically insulated manner.

Japanese Patent Laying-Open No. 2010-10762 (PTD 1) discloses a signal transfer circuit device used in a drive circuit device for a power semiconductor, the signal transfer circuit device transferring a control input signal by using a pulse transformer and including a self-diagnosis functional block for detecting and monitoring whether a transmitted signal is restored faithfully to the control input signal or not.

A method for transmitting a single digital signal by using an insulating element such as the pulse transformer or the photocoupler as described above includes a method for transmission with an oscillating pulse of a prescribed cycle by using one insulating element, and a method for transmitting a pulse based on rising and falling edges of a signal to be transmitted, by using two insulating elements.

In the case of transmitting two signals each having a different transmission speed, it is conceivable to use a combination of the aforementioned configurations for transmitting a single signal. However, if signal transmission is implemented by a simple combination of a plurality of signal transmission circuits, the number of components increases, which may lead to constraint on size reduction and increase in cost. Alternatively, when the signal transmission circuit using the oscillating pulse is utilized in the case of transmitting a signal having a high transmission speed, it is necessary to shorten the oscillation cycle, that is, to use the signal to have a higher frequency in order to prevent a delay in transmission caused by the oscillation cycle. Therefore, the power for an oscillation circuit increases, which may lead to decrease in efficiency of the entire circuit.

The present invention has been made to solve the aforementioned problem, and an object thereof is to provide a signal transmission circuit capable of transmitting a plurality of signals each having a different transmission speed in a mutually electrically insulated manner, by using a comparatively simple circuit.

SUMMARY OF THE INVENTION

A signal transmission circuit according to an aspect of the present invention includes a pulse generation unit, first and second transmission units, and first and second output units, and transmits first and second input signals. The pulse generation unit generates first and second pulse signals in accordance with logical states of the first and second input signals. The first and second transmission units transmit the first and second pulse signals from the pulse generation unit, respectively, in a mutually electrically insulated manner. The first output unit generates and outputs a first output signal indicating the first input signal, based on changes in the first pulse signal transmitted by the first transmission unit and the second pulse signal transmitted by the second transmission unit. The second output unit generates and outputs a second output signal indicating the second input signal, based on oscillation states of the transmitted first pulse signal and the transmitted second pulse signal.

Preferably, the first output unit sets the first output signal to logic high in accordance with a rising edge of the transmitted first pulse signal, and sets the first output signal to logic low in accordance with a rising edge of the transmitted second pulse signal.

Preferably, the second output unit sets the second output signal to logic high when either the transmitted first pulse signal or the transmitted second pulse signal is in an oscillating state, and sets the second output signal to logic low when both the transmitted first pulse signal and the transmitted second pulse signal are in a non-oscillating state.

Preferably, the pulse generation unit outputs the first pulse signal having an oscillating pulse train of a prescribed cycle to the first transmission unit, when the first input signal is logic high and the second input signal is logic high.

Preferably, the pulse generation unit outputs the second pulse signal having an oscillating pulse train of a prescribed cycle to the second transmission unit, when the first input signal is logic low and the second input signal is logic high.

Preferably, the pulse generation unit brings the first and second pulse signals to the first and second transmission units into a non-oscillating state, when the first input signal is logic low and the second input signal is logic low.

Preferably, a transmission speed required for the first input signal is set to be higher than a transmission speed required for the second input signal.

Preferably, each of the first and second transmission units is configured to include any one of a transformer, a photocoupler and a capacitor.

According to another aspect of the present invention, an integrated circuit is an integrated circuit into which the aforementioned signal transmission circuit is integrated.

According to another aspect of the present invention, an electric device includes the aforementioned signal transmission circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described in detail hereinafter with reference to the drawings, in which the same or corresponding portions are denoted by the same reference characters and description thereof will not be repeated.

[Example of Transmission Circuit for Single Signal]

As a method for transmitting a single digital signal in an insulated manner, there have been known (1) a method for generating and transmitting an oscillating pulse in accordance with a logical state of an input signal, and restoring the input signal based on whether this oscillating pulse is present or not, and (2) a method for generating and transmitting a start pulse and an end pulse corresponding to rising and falling edges of an input signal, respectively, and restoring the input signal in accordance with these start and end pulses.

Figure 1:
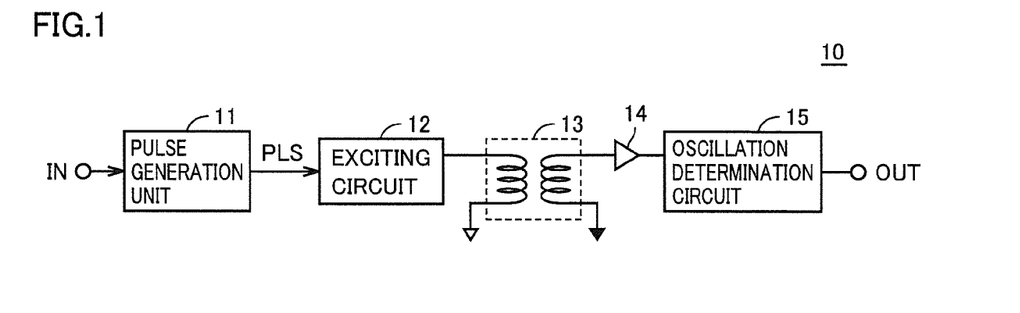
FIG. 1 is a block diagram showing a first example of a signal transmission circuit that transmits a single signal.
Figure 2:
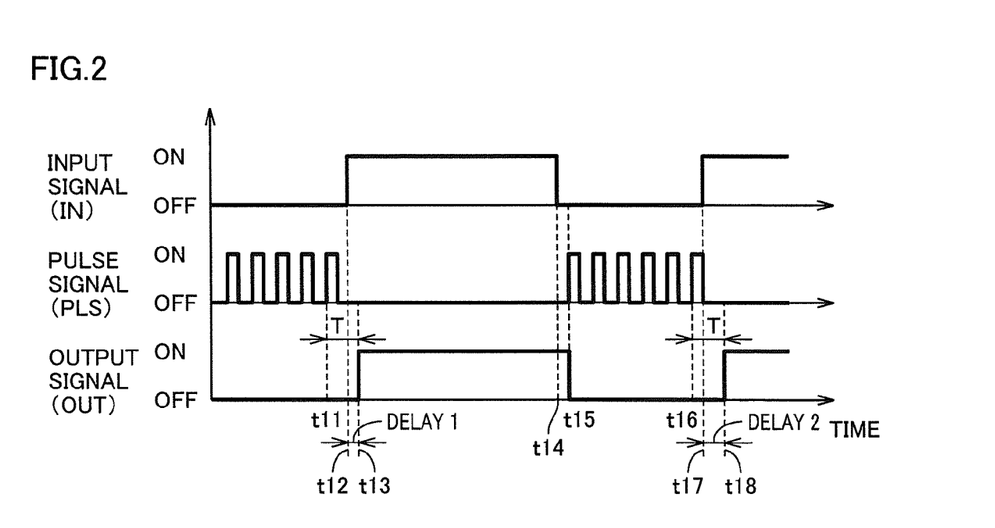
FIG. 2 is a time chart for describing the operation of the signal transmission circuit in FIG. 1.

FIG. 1 is a block diagram for describing a signal transmission circuit 10 in the above case (1) in which the signal is transmitted by using the oscillating pulse. FIG. 2 is a time chart for describing the operation of signal transmission circuit 10 in FIG. 1.

Referring to FIGS. 1 and 2, signal transmission circuit 10 includes a pulse generation unit 11, an exciting circuit 12, a transmission unit 13, a pulse detection unit 14, and an oscillation determination circuit 15.

In accordance with a logical state of an input signal IN received at an input terminal, pulse generation unit 11 generates an oscillating pulse PLS that oscillates at a prescribed cycle. Pulse generation unit 11 then outputs generated oscillating pulse PLS to exciting circuit 12 as a drive signal for driving transmission unit 13.

More specifically, as shown in FIG. 2, pulse generation unit 11 is configured to output oscillating pulse PLS in an oscillating state when the logical state of input signal IN is logic low, and to output the oscillating pulse in a non-oscillating state when the logical state of input signal IN is logic high. Contrary to this, pulse generation unit 11 may be configured to output oscillating pulse PLS in the non-oscillating state when input signal IN is logic low, and to output oscillating pulse PLS in the oscillating state when input signal IN is logic high.

Exciting circuit 12 is a circuit for exciting a pulse transformer included in transmission unit 13 based on oscillating pulse signal PLS. By the pulse transformer, transmission unit 13 can transmit the pulse signal while achieving electrical insulation between the input side and the output side.

The transmission unit can also have a configuration other than the pulse transformer as long as it can transmit the pulse signal in an electrically insulated manner. For example, the transmission unit can also be configured by a photocoupler. In this case, the exciting circuit may be omitted, or an alternative circuit such as an amplification circuit may be provided instead of the exciting circuit. In addition, a capacitor may also be used as the transmission unit. In this case, a configuration for discharging the capacitor when the exciting circuit is brought into a non-exciting state may be added.

Oscillating pulse PLS transmitted by transmission unit 13 is detected by pulse detection unit 14 coupled to an output of transmission unit 13, and is transmitted to oscillation determination circuit 15.

Oscillation determination circuit 15 receives oscillating pulse PLS transmitted by transmission unit 13, and determines an oscillation state of received oscillating pulse PLS. Then, oscillation determination circuit 15 outputs an output signal OUT as logic low when oscillating pulse PLS is in the oscillating state, and outputs output signal OUT as logic high when oscillating pulse PLS is in the non-oscillating state.

Signal transmission circuit 10 as shown in FIG. 1 can be configured in a comparatively simple manner because signal transmission circuit 10 has one transmission unit 13. In addition, signal transmission circuit 10 converts the input signal into the oscillating pulse and transmits the oscillating pulse. Therefore, when the photocoupler is, for example, used as the transmission unit, there is an advantage that the power consumption can be reduced as compared with the case of transmitting a signal which reflects the state of the input signal.

In signal transmission circuit 10 as shown in FIG. 1, however, a time delay as shown in FIG. 2 may occur between input signal IN and output signal OUT because the oscillating pulse is used.

Specifically, in FIG. 2, the following case is assumed: the logical state of input signal IN is switched from logic low to logic high at time t12 which is shortly after the oscillating pulse is outputted at time t11 and before the next oscillating pulse is outputted. In this case, although the next oscillating pulse is not outputted from pulse generation unit 11, oscillation determination circuit 15 recognizes that the logical state of the input signal has changed, based on the fact that the oscillating pulse has not yet been outputted after a prescribed cycle T at which this next oscillating pulse should be outputted. In other words, a time delay of up to oscillation cycle T may occur.

As can be seen from comparison between time t12 and time t17, an amount of delay between a rising edge of input signal IN and a rising edge of output signal OUT may vary depending on a timing of a rising edge of input signal IN. In addition, at a falling edge of input signal IN as well, a delay caused by the oscillation cycle of oscillating pulse PLS may occur.

As described above, in signal transmission circuit 10 using the oscillating pulse as shown in FIG. 1, such a state may occur that accurate synchronization between input signal IN and output signal OUT cannot be achieved. Therefore, signal transmission circuit 10 tends to be unsuitable for an application in which the high-precision operation timing is required, such as a drive signal for a switching element included in an inverter and the like, for example.

Figure 3:
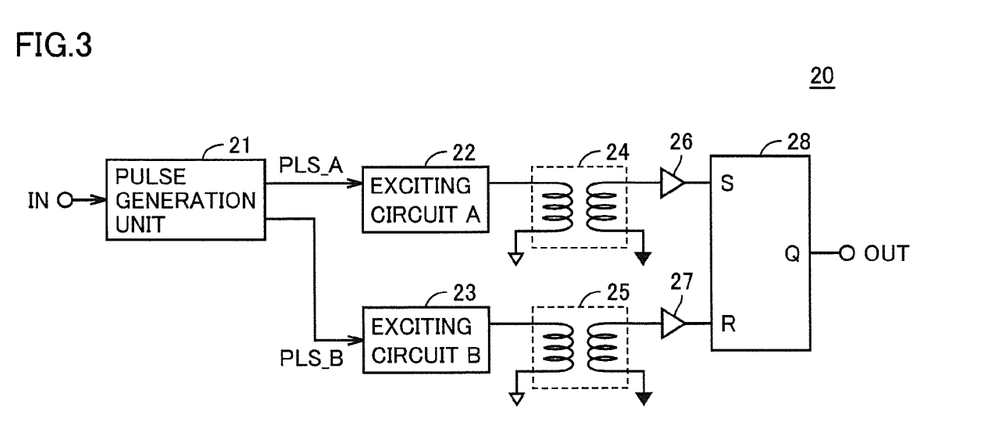
FIG. 3 is a block diagram showing a second example of a signal transmission circuit that transmits a single signal.
Figure 4:
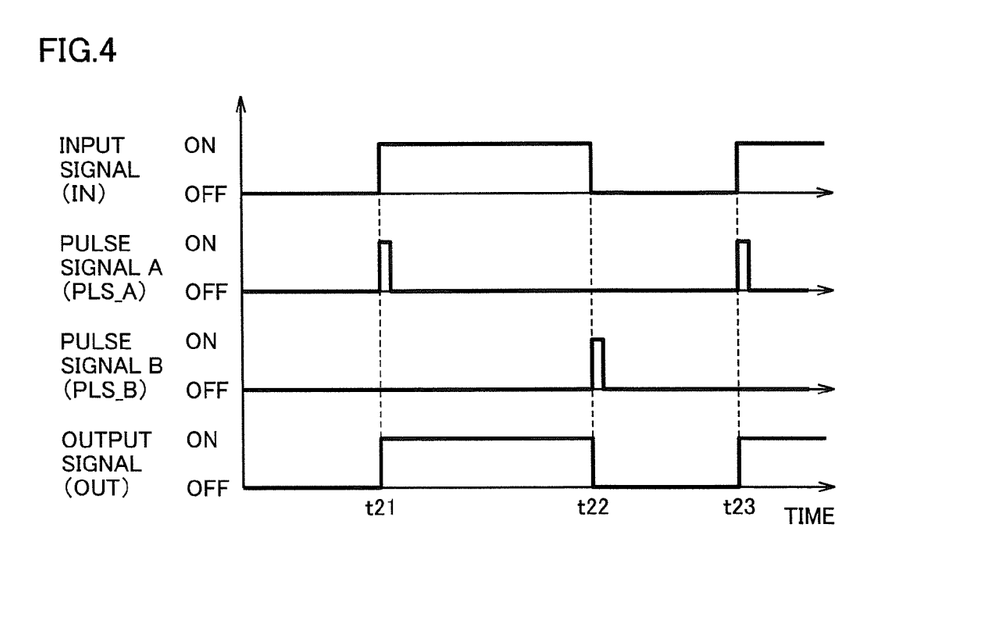
FIG. 4 is a time chart for describing the operation of the signal transmission circuit in FIG. 3.

FIG. 3 is a block diagram for describing a signal transmission circuit 20 in the above case (2) in which the input signal is transmitted by using the start and end pulses. FIG. 4 is a time chart for describing the operation of signal transmission circuit 20 in FIG. 3.

Referring to FIG. 3, signal transmission circuit 20 includes a pulse generation unit 21, exciting circuits 22 and 23, transmission units 24 and 25, pulse detection units 26 and 27, and a latch circuit 28.

Pulse generation unit 21 receives input signal IN from an input terminal. In accordance with a logical state of received input signal IN, pulse generation unit 21 generates pulse signals PLS_A and PLS_B, and outputs pulse signals PLS_A and PLS_B to exciting circuits 22 and 23, respectively.

As shown in FIG. 4, pulse signal PLS_A is a pulse signal having a prescribed duration, which is generated at a rising edge at which the logical state of input signal IN is switched from logic low to logic high. Pulse signal PLS_B is a pulse signal having a prescribed duration, which is generated at a falling edge at which the logical state of input signal IN is switched from logic high to logic low.

Exciting circuits 22 and 23 are circuits for exciting pulse transformers included in transmission units 24 and 25, based on pulse signals PLS_A and PLS_B, respectively. By the pulse transformers, transmission units 24 and 25 can transmit the pulse signals while achieving electrical insulation between the input side and the output side.

Similarly to FIG. 1, the transmission units can also have a configuration other than the pulse transformer as long as they can transmit the pulse signals in an electrically insulated manner.

Pulse signals PLS_A and PLS_B transmitted to the output sides of transmission units 24 and 25 are detected by pulse detection units 26 and 27, respectively, and are outputted to latch circuit 28.

Latch circuit 28 is typically configured by a flip flop. A set input (S) of latch circuit 28 receives pulse signal PLS_A transmitted by transmission unit 24. A reset input (R) of latch circuit 28 receives pulse signal PLS_B transmitted by transmission unit 25.

At a rising edge of pulse signal PLS_A received at the set input (S), latch circuit 28 sets and keeps output signal OUT outputted from an output (Q) at the logic high state (times t21 and t23 in FIG. 4). On the other hand, at a rising edge of pulse signal PLS_B received at the reset input (R), latch circuit 28 sets and keeps output signal OUT outputted from the output (Q) at the logic low state (time t22 in FIG. 4).

In other words, pulse signal PLS_A functions as the start pulse when restoring input signal IN, and pulse signal PLS_B functions as the end pulse when restoring input signal IN.

As compared with signal transmission circuit 10 in FIG. 1, signal transmission circuit 20 shown in FIG. 3 requires two transmission units 24 and 25, and thus, the number of components increases, which leads to more or less complicated circuit configuration.

In signal transmission circuit 20, however, by using pulse signals PLS_A and PLS_B, timings of rising and falling of input signal IN can be restored without any time delay. Therefore, high-precision signal transmission can be achieved as compared with signal transmission circuit 10 shown in FIG. 1.

Furthermore, the transmitted signals are only the start pulse and the end pulse, and the number of pulses with respect to the change in input signal IN does not change regardless of the signal transmission speed. Therefore, even in the case of signal transmission at high speed, the power consumption does not increase significantly.

As described above, signal transmission circuit 20 shown in FIG. 3 has a circuit configuration suitable for high-speed and high-precision signal transmission.

[Description of Signal Transmission Circuit According to the Present Embodiment]

As a method for transmitting two digital signals each having a different transmission speed in a mutually insulated manner, it is conceivable to appropriately combine the signal transmission circuits described with reference to FIGS. 1 and 3 above.

In this case, from the viewpoints of cost and required circuit area, it is desirable to minimize the number of components and achieve a simple circuit configuration. In this regard, it is conceivable to use two signal transmission circuits shown in FIG. 1. On the other hand, however, high-precision signal transmission with less time delay between the input signal and the output signal may be required in some cases, depending on the transmission speed and/or the application. In such a case, the signal transmission circuit shown in FIG. 1 may be insufficient as described above.

In the present embodiment, there is provided a signal transmission circuit capable of transmitting two digital signals each having a different transmission speed in a mutually electrically insulated manner, by using a comparatively simple circuit configuration.

Figure 5:
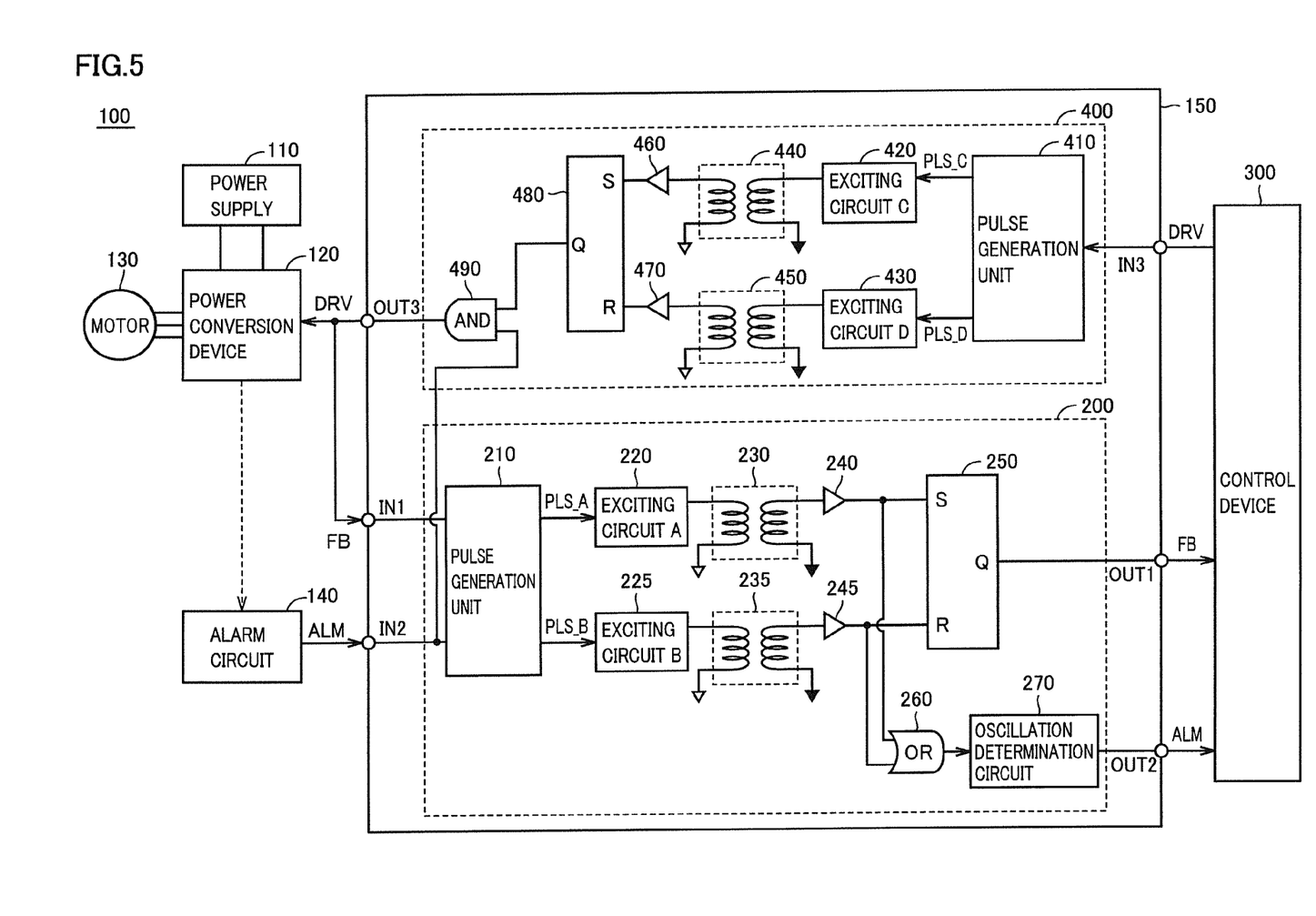
FIG. 5 is an overall block diagram of a motor drive system to which the signal transmission circuit according to the present embodiment is applied.

FIG. 5 is an overall block diagram of a motor drive system 100 to which the signal transmission circuit according to the present embodiment is applied. Motor drive system 100 is used in, for example, home electric appliances, electric vehicles and the like. It should be noted that motor drive system 100 is one example of an electric device to which the signal transmission circuit according to the present embodiment is applied. The signal transmission circuit is also applicable to electric devices other than the motor drive system as long as it is used in the application in which two digital signals each having a different transmission speed need to be transmitted in a mutually electrically insulated manner.

Referring to FIG. 5, motor drive system 100 includes a power supply 110, a power conversion device 120, a motor 130, an alarm circuit 140, a signal transmission device 150, and a control device 300.

Signal transmission device 150 includes a first signal transmission circuit 200 according to the present embodiment and a second signal transmission circuit 400 having the configuration described with reference to FIG. 3. Second signal transmission circuit 400 is a circuit for transmitting a drive signal DRV for driving motor 130 from control device 300 to power conversion device 120. First signal transmission circuit 200 is a circuit for transmitting drive signal DRV transmitted by second signal transmission circuit 400 to control device 300 as a feedback signal FB and transmitting, to control device 300, an abnormality signal ALM that is generated at alarm circuit 140 to indicate an abnormality in the system.

Power supply 110 is configured by an AC power supply such as a commercial power supply or a DC power supply such as a battery.

Power conversion device 120 is typically configured to include an inverter or a converter having a power switching element. Power conversion device 120 converts electric power supplied from power supply 110 and drives motor 130.

Control device 300 generates drive signal DRV for driving motor 130. Control device 300 also receives feedback signal FB and abnormality signal ALM from first signal transmission circuit 200, and monitors whether drive signal DRV is properly transmitted or not and whether there is an abnormality in the system or not. If signal transmission is not performed normally or if there is an abnormality in the system, control device 300, for example, shuts down power conversion device 120 or notifies the user of occurrence of the abnormality by using a not-shown notification device.

Based on signals from a not-shown current sensor, a not-shown temperature sensor and the like, alarm circuit 140 detects the abnormality in the system such as the overcurrent and overheating state of power conversion device 120 or decrease in power supply voltage. Alarm circuit 140 then outputs abnormality signal ALM to control device 300 via signal transmission device 150. Although alarm circuit 140 is shown as a configuration different from power conversion device 120 in FIG. 5, alarm circuit 140 may be included in the function of a control unit (not shown) included in power conversion device 120.

As described above, first signal transmission circuit 200 transmits feedback signal FB and abnormality signal ALM to control device 300.

Since feedback signal FB is a signal for monitoring whether drive signal DRV of power conversion device 120 is properly transmitted or not, comparatively high-speed and high-precision transmission is required, and the transmission speed of the order of several microseconds or lower is required, for example. On the other hand, abnormality signal ALM may be transmitted at a lower speed than feedback signal FB, and the transmission speed of the order of several milliseconds is required, for example. First signal transmission circuit 200 thus transmits the two signals each having a different transmission speed.

First signal transmission circuit 200 includes a pulse generation unit 210, exciting circuits 220 and 225, transmission units 230 and 235, pulse detection units 240 and 245, a latch circuit 250, an OR circuit 260, and an oscillation determination circuit 270.

Schematically, first signal transmission circuit 200 has a circuit configuration obtained by integrating signal transmission circuit 10 in FIG. 1 and signal transmission circuit 20 in FIG. 3. Pulse signals PLS_A and PLS_B transmitted by transmission units 230 and 235 are transmitted to two inputs (S, R) of latch circuit 250, respectively, and are also transmitted to oscillation determination circuit 270 via OR circuit 260.

From control device 300, pulse generation unit 210 receives feedback signal FB as an input signal IN1, and receives abnormality signal ALM of the system as an input signal IN2.

In the example of the present embodiment, a corresponding switching element in power conversion device 120 is turned on when drive signal DRV is logic high, and is turned off when drive signal DRV is logic low. The same is applied as well to feedback signal FB. In addition, abnormality signal ALM indicates logic high when there is no abnormality, and indicates logic low when there is an abnormality.

Based on a combination of these input signals IN1 and IN2, pulse generation unit 210 generates pulse signals PLS_A and PLS_B. Each of these pulse signals PLS_A and PLS_B is an oscillating pulse having a fixed cycle, similarly to pulse signal PLS in signal transmission circuit 10 shown in FIG. 1.

Pulse signal PLS_A is brought into the oscillating state when a condition that input signal IN1 (FB) and input signal IN2 (ALM) are both logic high is satisfied, and is brought into the non-oscillating state under the other conditions.

Pulse signal PLS_B is brought into the oscillating state when a condition that input signal IN1 (FB) is logic low and input signal N2 (ALM) is logic high is satisfied. As for pulse signal PLS_B, only one pulse is outputted when a condition that input signal IN1 (FB) and input signal IN2 (ALM) are both logic low is satisfied.

In the present embodiment, when an abnormality in the system is detected, power conversion device 120 is stopped. Therefore, the state of input signal IN1 (FB) being logic high and input signal IN2 (ALM) being logic low could never occur virtually. However, if such a condition is satisfied, the oscillating states of pulse signals PLS_A and PLS_B are stopped and pulse signals PLS_A and PLS_B attain the logic low state.

Pulse generation unit 210 outputs generated pulse signals PLS_A and PLS_B to exciting circuits 220 and 225, respectively.

In accordance with pulse signals PLS_A and PLS_B, exciting circuits 220 and 225 excite pulse transformers included in transmission units 230 and 235, respectively. By the pulse transformer, each transmission unit transmits the pulse signal while achieving electrical insulation between the input side and the output side.

Pulse signal PLS_A transmitted by transmission unit 230 is detected by pulse detection unit 240, and is transmitted to a set input (S) of latch circuit 250. Pulse signal PLS_B transmitted by transmission unit 235 is detected by pulse detection unit 245, and is transmitted to a reset input (R) of latch circuit 250.

At a first rising edge of the pulse received at set input (S), latch circuit 250 sets and keeps an output signal OUT1 outputted from an output (Q) at the logic high state. On the other hand, at a first rising edge of the pulse received at reset input (R), latch circuit 250 sets and keeps output signal OUT1 at the logic low state.

Output signal OUT1 from latch circuit 250 corresponds to feedback signal FB, and first signal transmission circuit 200 outputs output signal OUT1 to control device 300.

Two inputs of OR circuit 260 are connected to a signal transmission path connecting pulse detection unit 240 and latch circuit 250, and a signal transmission path connecting pulse detection unit 245 and latch circuit 250, respectively, and receive pulse signals PLS_A and PLS_B transmitted by transmission unit 230 and transmission unit 235, respectively. OR circuit 260 performs the logical OR operation of received pulse signals PLS_A and PLS_B, and outputs the result to oscillation determination circuit 270.

Similarly to oscillation determination circuit 15 in FIG. 1, oscillation determination circuit 270 sets an output signal OUT2 to logic high when the signal received from the OR circuit is in the oscillating state, and sets output signal OUT2 to logic low when the signal received from the OR circuit is in the non-oscillating state.

Output signal OUT2 from oscillation determination circuit 270 corresponds to abnormality signal ALM, and first signal transmission circuit 200 outputs output signal OUT2 to control device 300.

Since the second signal transmission circuit transmits drive signal DRV of power conversion device 120, comparatively high-speed and high-precision signal transmission is required. Therefore, in the present embodiment, the configuration similar to that of signal transmission circuit 20 described with reference to FIG. 3 is used as the second signal transmission circuit.

Second signal transmission circuit 400 includes a pulse generation unit 410, exciting circuits 420 and 430, transmission units 440 and 450, pulse detection units 460 and 470, a latch circuit 480, and an AND circuit 490. Description of the configuration similar to that of signal transmission circuit 20 in FIG. 3 except for AND circuit 490 will not be repeated.

AND circuit 490 has a first input connected to an output of latch circuit 480, and a second input that receives abnormality signal ALM.

When the signal at the second input is logic high, i.e., when an abnormality is not detected at alarm circuit 140, AND circuit 490 outputs transmitted drive signal DRV to power conversion device 120. When an abnormality is detected at alarm circuit 140 (i.e., when the second input receives logic low), only the logic low signal is transmitted to power conversion device 120 regardless of output of latch circuit 480. Therefore, when an abnormality occurs, the switching operation of power conversion device 120 is stopped and power conversion device 120 is shut down.

Figure 6:
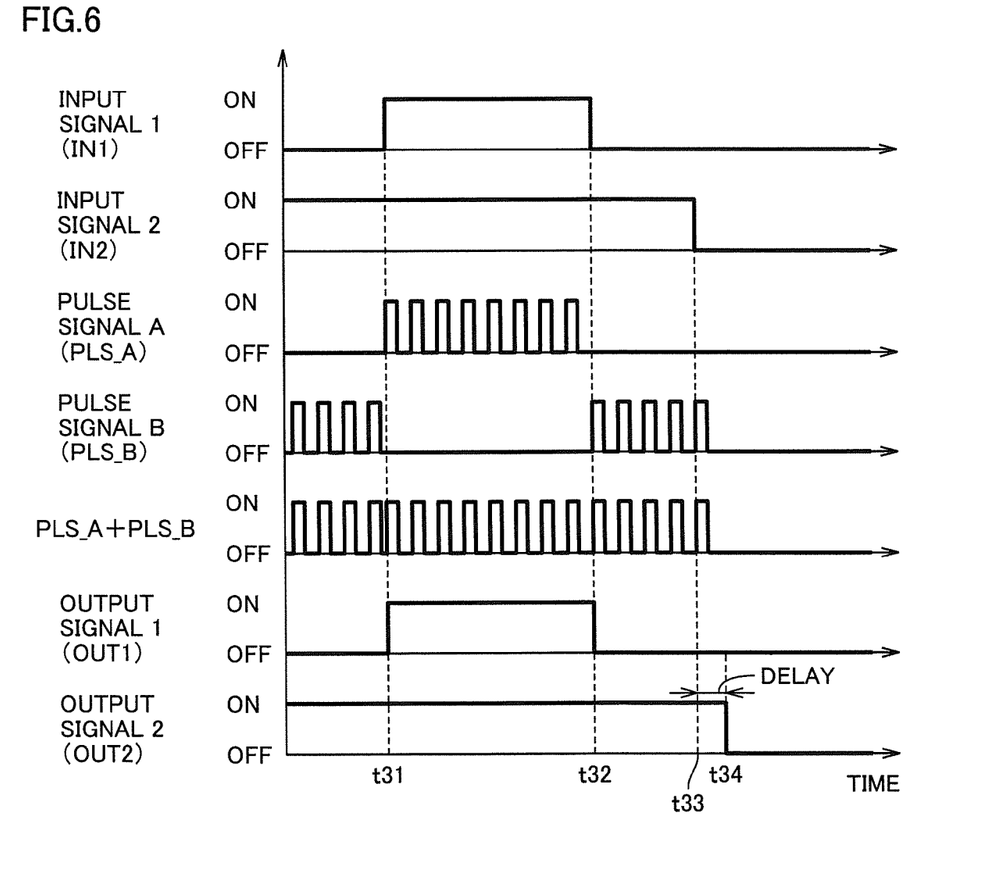
FIG. 6 is a time chart for describing the signal transmission operation in the signal transmission circuit in FIG. 5.

FIG. 6 is a time chart for describing the signal transmission operation in first signal transmission circuit 200 in FIG. 5. In FIG. 6, the horizontal axis represents time and the vertical axis represents input signals IN1 and IN2, pulse signals PLS_A and PLS_B, the signal (PLS_A+PLS_B) provided from OR circuit 260 to oscillation determination circuit 270, and output signals OUT1 and OUT2.

Referring to FIGS. 5 and 6, before time t31, input signal IN1, which is feedback signal FB, is in the logic low state and input signal IN2, which is abnormality signal ALM, is in the logic high state. In this state, pulse generation unit 210 maintains pulse signal PLS_A in the non-oscillating state and causes pulse signal PLS_B to oscillate. As a result, latch circuit 250 is reset and output signal OUT1 becomes logic low.

On the other hand, since the oscillating pulse from pulse signal PLS_B is inputted to OR circuit 260, output from oscillation determination circuit 270 becomes logic high.

At time t31, input signal IN1 is switched to logic high. Then, both input signals IN1 and IN2 attain the logic high state. Therefore, in pulse generation unit 210, oscillation of pulse signal PLS_A is started and pulse signal PLS_B is switched to the non-oscillating state.

As a result of this switching of the pulse signals, latch circuit 250 is set and output signal OUT1 of latch circuit 250 is switched to logic high at a first rising edge of the oscillating pulse of pulse signal PLS_A (time t31). Pulse signal PLS_B is switched to the non-oscillating state, while pulse signal PLS_A attains the oscillating state. Therefore, output from OR circuit 260 is maintained in the oscillating state and the logic high state of output signal OUT2 from oscillation determination circuit 270 is continued.

At time t32, input signal IN1 is switched to logic low. Then, the state similar to the state before time t31 occurs. Therefore, pulse signal PLS_A is switched to the non-oscillating state and oscillation of pulse signal PLS_B is started.

At this time, latch circuit 250 is reset and output signal OUT1 of latch circuit 250 is switched to logic low at a first rising edge of pulse signal PLS_B (time t32). Since pulse signal PLS_B attains the oscillating state, output signal OUT2 of oscillation determination circuit 270 is maintained in the logic high state.

Thereafter, when an abnormality occurs in the system and input signal IN2 is switched to logic low (time t33), both input signals IN1 and IN2 become logic low. In this state, pulse signal PLS_A is maintained in the non-oscillating state, and thus, output signal OUT1 is also maintained in the logic low state.

On the other hand, as for pulse signal PLS_B, only one pulse is outputted at a timing when both input signals IN1 and IN2 become logic low (time t33), and thereafter, pulse signal PLS_B is switched to the non-oscillating state. As a result, both pulse signals PLS_A and PLS_B attain the non-oscillating state after the pulse is outputted at time t33, and thus, output signal OUT2 is switched to logic low in oscillation determination circuit 270.

The reason why only one pulse is outputted at the timing when both input signals IN1 and IN2 become logic low is, for example, to prevent the following: when input signal IN2 is switched to logic low with input signal IN1 being logic high, i.e., with pulse signal PLS_A being in the oscillating state, latch circuit 250 cannot be reset and output signal OUT1 is maintained in the logic high state if this one pulse is not outputted.

As described above, the logical state of feedback signal FB is switched in accordance with the rising edges at the time of switching pulse signals PLS_A and PLS_B. Therefore, as for output signal OUT1, a signal without any time delay is restored.

On the other hand, the logical state of abnormality signal ALM is switched based on whether the oscillating state is present or not. Therefore, a time delay similar to that in signal transmission circuit 10 in FIG. 1 occurs. Furthermore, since one pulse is outputted at the timing when both input signals IN1 and IN2 become logic low, a delay occurs in a timing when output signal OUT2 becomes logic low (time t34). As described above, however, the accuracy of synchronization between input signal IN2 and output signal OUT2 required for abnormality signal ALM is not so high as the accuracy required for feedback signal FB, and thus, the impact of this delay is small.

Figure 7:
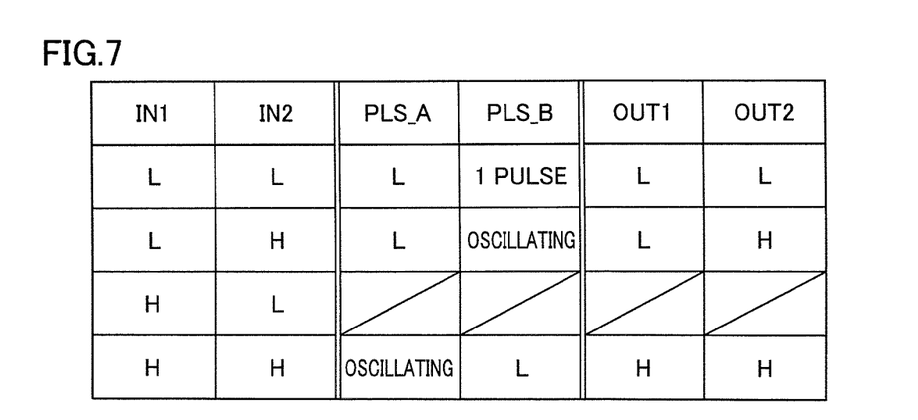
FIG. 7 is a diagram for describing logical states at inputs, transmission units and outputs in the signal transmission circuit in FIG. 5.

The relationship among the logical states of input signals IN1 and IN2, pulse signals PLS_A and PLS_B, and output signals OUT1 and OUT2 is summarized in FIG. 7. Since the relationship among these signals has been described above, description thereof will not be repeated in FIG. 7.

With such a configuration of the signal transmission circuit, in particular, the number of the pulse transformers which are the transmission units can be minimized, and the two signals each having a different transmission speed can be transmitted in a mutually electrically insulated manner, without no time delay in the signal on the high-speed side. Furthermore, even when the transmission speed on the high-speed side is high, it is not necessary to increase the oscillation frequency of the pulse signals, and thus, increase in power consumption caused by increase in transmission speed can be suppressed.

In the foregoing description, the case where the two signals to be transmitted are the drive signal for the switching element and the abnormality signal for the system has been described by way of example. It should be noted, however, that the signals to be transmitted are appropriately set depending on applications to which the signal transmission circuit according to the present embodiment is applied.

Figure 8:
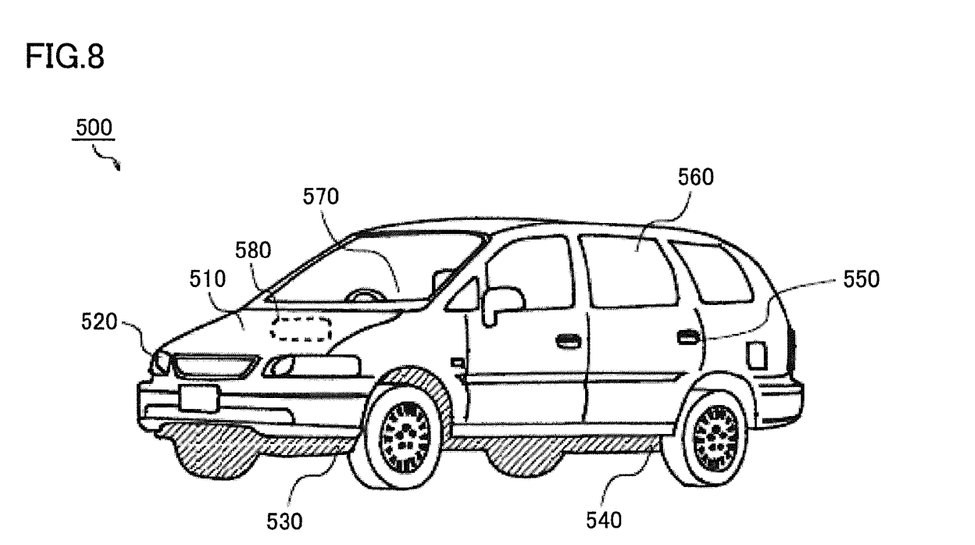
FIG. 8 shows an outer appearance of a vehicle to which the signal transmission circuit according to the present embodiment is applied.

As described above, the signal transmission circuit according to the present embodiment is applicable to various electric devices that transmit two digital signals each having a different transmission speed in a mutually electrically insulated manner. With reference to FIG. 8, description will be given hereinafter of an example of the case where the signal transmission circuit is applied to a vehicle.

FIG. 8 shows an outer appearance of a vehicle 500 to which the signal transmission circuit according to the present embodiment is applied. Vehicle 500 includes various electric devices 510 to 580. The mounting position of each electric device in FIG. 8 is by way of illustration, and each electric device may be located at different positions depending on types of vehicles. In addition, it is not necessary to mount all of electric devices 510 to 580. Depending on types of vehicles, it could be that a part of electric devices 510 to 580 are not mounted.

For transmission of the two signals each having a different transmission speed in a mutually electrically insulated manner, signal transmission circuit 200 described with reference to FIG. 5 can be used in these electric devices 510 to 580.

Electric device 510 is an engine control unit for executing engine-related control. The engine-related control includes, for example, injection control, electronic throttle control, idling control, oxygen sensor heater control, auto-cruise control and the like.

Electric device 520 is a lamp control unit for executing light-on/light-off control of lighting such as a high intensity discharged (HID) lamp or a daytime running lamp (DRL).

Electric device 530 is a transmission control unit for executing transmission-related control.

Electric device 540 is a body control unit for executing control related to the movement of vehicle 500. The control related to the movement of vehicle 500 includes, for example, anti-lock brake system (ABS) control, electric power steering (EPS) control, electronic suspension control and the like.

Electric device 550 is a security control unit for driving a door lock, a security alarm and the like.

Electric device 560 is an electric device incorporated into vehicle 500 at the time of factory shipment, such as an electric device included in vehicle 500 as standard, or an electric device mounted as a manufacturer's option. Such an electric device includes, for example, a wiper, an electrically-driven door mirror, a power window, a shock absorber (damper), an electrically-driven sun roof, an electrically-driven seat and the like.

Electric device 570 is an electric device optionally attached to vehicle 500 by the user. Electric device 570 includes, for example, an AV (Audio/Visual) device, a car navigation system, an ETC (Electronic Tool Collection) system and the like.

Electric device 580 is an electric device driven by a motor, such as a vehicle-mounted blower, an oil pump, a water pump, and a battery cooling fan.

The signal transmission circuit according to the present embodiment is also applicable to electric devices other than aforementioned electric devices 510 to 580 mounted on the vehicle.

"Latch circuit 250" in the present embodiment is one example of "first output unit" in the present invention. In addition, "oscillation determination circuit 270" in the present embodiment is one example of "second output unit" in the present invention.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A signal transmission circuit for transmitting first and second input signals, comprising:
    a pulse generation unit configured to generate first and second pulse signals in accordance with logical states of the first and second input signals;
    first and second transmission units configured to transmit the first and second pulse signals from the pulse generation unit, respectively, in a mutually electrically insulated manner;
    a first output unit configured to generate and output a first output signal indicating the first input signal, based on changes in the first pulse signal transmitted by the first transmission unit and the second pulse signal transmitted by the second transmission unit; and
    a second output unit configured to generate and output a second output signal indicating the second input signal, based on oscillation states of the transmitted first pulse signal and the transmitted second pulse signal.

2. The signal transmission circuit according to claim 1, wherein
    the first output unit sets the first output signal to logic high in accordance with a rising edge of the transmitted first pulse signal, and sets the first output signal to logic low in accordance with a rising edge of the transmitted second pulse signal.

3. The signal transmission circuit according to claim 1, wherein
    the second output unit sets the second output signal to logic high when either the transmitted first pulse signal or the transmitted second pulse signal is in an oscillating state, and sets the second output signal to logic low when both the transmitted first pulse signal and the transmitted second pulse signal are in a non-oscillating state.

4. The signal transmission circuit according to claim 1, wherein
    the pulse generation unit outputs the first pulse signal having an oscillating pulse train of a prescribed cycle to the first transmission unit, when the first input signal is logic high and the second input signal is logic high.

5. The signal transmission circuit according to claim 1, wherein
    the pulse generation unit outputs the second pulse signal having an oscillating pulse train of a prescribed cycle to the second transmission unit, when the first input signal is logic low and the second input signal is logic high.

6. The signal transmission circuit according to claim 1, wherein
    the pulse generation unit brings the first and second pulse signals to the first and second transmission units into a non-oscillating state, when the first input signal is logic low and the second input signal is logic low.

7. The signal transmission circuit according to claim 1, wherein
    a transmission speed required for the first input signal is set to be higher than a transmission speed required for the second input signal.

8. The signal transmission circuit according to claim 1, wherein
    each of the first and second transmission units is configured to include any one of a transformer, a photocoupler and a capacitor.

9. An integrated circuit, into which the signal transmission circuit as recited in claim 1 is integrated.

10. An electric device, including the signal transmission circuit as recited in claim 1.

* * * * *